United States Patent [19]

Rudik et al.

[11] Patent Number: 4,855,333

[45] Date of Patent: Aug. 8, 1989

[54] MULTIPLE WIRE PHOTOSENSITIVE ADHESIVE FOR WIRE EMBEDMENT

[75] Inventors: William J. Rudik; George P. Schmitt, both of Vestal; John F. Shipley, Endwell, all of N.Y.

[73] Assignee: International Business Machines Corp., Armonk, N.Y.

[21] Appl. No.: 35,207

[22] Filed: Apr. 6, 1987

Related U.S. Application Data

[63] Continuation of Ser. No. 392,997, Jun. 28, 1982, abandoned.

[51] Int. Cl.[4] .............................................. C08L 63/00
[52] U.S. Cl. ........................................ 522/71; 522/83; 522/100; 522/103; 428/413; 428/417; 428/418
[58] Field of Search ................... 522/100, 103, 71, 77, 522/83; 525/482

[56] References Cited

U.S. PATENT DOCUMENTS

| | | | |
|---|---|---|---|
| 3,646,572 | 2/1972 | Burr | 174/68.5 |
| 3,888,942 | 6/1975 | Tsen | 525/930 |
| 3,980,483 | 9/1976 | Nishikubo et al. | 204/159.15 |
| 4,169,732 | 10/1979 | Shipley | 96/35.1 |
| 4,180,608 | 12/1979 | Del | 428/196 |
| 4,212,960 | 7/1980 | Hayashi et al. | 525/930 |
| 4,309,473 | 1/1982 | Minamisawa et al. | 525/930 |

OTHER PUBLICATIONS

Modern Plastics Encyclopedia, vol. 44, No. 1A, Sep. 1966, pp. 494–497, 499, 501, 504, 505.

Primary Examiner—John C. Bleutge
Assistant Examiner—A. Carrillo
Attorney, Agent, or Firm—Pollock, Vande Sande & Priddy

[57] ABSTRACT

A high density dimensionally stable encapsulated wire circuit board and a method of making such a board is described. A photo-curable adhesive having a unique combination of rheological properties is utilized to bond insulated wires to a substrate. The unique combination of rheological properties of the adhesive used in the encapsulated wire circuit board of this invention include a specified range of values for the Storage Shear Modulus and specified range of values for the Loss Angle ratio.

A new photo-curable adhesive having these properties and a method of obtaining such an adhesive are also described.

25 Claims, 1 Drawing Sheet

MULTIPLE WIRE PHOTOSENSITIVE ADHESIVE FOR WIRE EMBEDMENT

CROSS REFERENCE TO RELATED APPLICATIONS

This application is a continuation of Ser. No. 392,997, filed on June 28, 1982, now abandoned.

(a) co-pending application now abandoned, Ser. No. 392,996 entitled "High Density Encapsulated Wire Circuit Board" by K. Varker which was filed on the same day as the present application and which is assigned to the same assignee as this application describes a method for making an encapsulated wire circuit board using a curable adhesive.

(b) patent application now abandoned, Ser. No. 392,998 entitled "Process for Making an Encapsulated Circuit Board and Products made thereby" by Grant et. al. which was filed on the same day as the present application and which is assigned to the same assignee as this application describes a method for making an encapsulated wire circuit board using a photo-curable adhesive.

BACKGROUND OF THE INVENTION

1. Field of Invention

The present invention relates to circuit boards for electronic components and more particularly to a circuit board having encapsulated wires which are bonded to a substrate by a photo-curable adhesive.

2. Description of Prior Art

The art of making circuit boards is well developed. The technique most widely used to fabricate circuit boards is generally referred to as the subtractive processes. This process begins with a sheet of copper on a substrate. The copper sheet is etched to form a pattern of desired circuit paths. A more advanced technique for fabricating circuit boards is termed the additive process. The additive process begins with an insulating substrate and adds copper where needed to form the desired circuit lines. One way of practicing the additive process to fabricate circuit boards is described in U.S. Pat. No. 4,030,190.

An alternative way to fabricate circuit boards involves encapsulating insulated wires in an adhesive. The resulting circuit board is generally termed an encapsulated wire circuit board. Encapsulated wire circuit boards are commercially available under the trade name "Multiwire" which is owned by the Kollmorgen Corporation. The encapsulated wire technique is shown in U.S. Pat. Nos. 4,097,684 (Burr); 3,646,772 (Burr); 3,674,914 (Burr) and 3,674,602 (Keough).

Co-pending application Ser. No. 392,966 by Varker entitled "High Density Encapsulated Wire Circuit Board" describes a technique for making an encapsulated wire circuit board wherein the insulated wires are firmly bonded to a relatively thick layer of copper which is covered by a layer of pre-preg. The expansion and contraction of the board during thermal cycling is controlled by the copper and therefore there is not any significant amount of unpredictable variations in the dimensions of the board. Holes can be very accurately drilled at precise locations in such boards. In the technique shown in the co-pending Varker application insulated wires are bonded to a substrate utilizing a heat curable adhesive so that after the adhesive is cured the wires can not move relative to the substrate.

The aforementioned patent application Ser. No. 392,998, now abandoned, entitled "Process for Making an Encapsulated Circuit Board and Products Made Thereby" by Grant et al describes an improvement of the circuit board and process described in the Varker co-pending application. The Grant et. al. application describes the fabrication of an encapsulated wire board using a photo-curable adhesive material. In the technique described in the Grant et. al. patent application, the wires are laid in a photo-curable adhesive, this adhesive is exposed to light, thereby curing the adhesive and firmly bonding the wires to the substrate. The Grant et. al. application describes the use of the material describes in U.S. Pat. No. 4,169,732 (Shipley). The material described in U.S. Pat. No. 4,169,732 does not have the unique combination of rheological properties of the photo-curable material required to practice the present invention.

SUMMARY OF THE INVENTION

The present invention provides an encapsulated wire circuit board which includes an improved photo-curable adhesive which has a unique combination of rheological properties. Encapsulated wire circuit boards fabricated in accordance with the present invention can be fabricated efficiently due to the unique combination of rheological properties of the adhesive. These same rheological properties give encapsulated circuit boards made in accordance with the present invention a high degree of dimensional stability. Thus, the present invention both facilitates the manufacturing operation and results in an improved encapsulated wire circuit board.

It is known that the rheological properties of viscoelastic materials can be described in terms of the responses to sinusoidal inputs. For example, see the text Applied Mathematical Sciences, Vol. 7, entitled "Lectures on Viscoelasticity Theory" by A. C. Pipkin 1972 (Library of Congress Catalog Card No. 74-186996). The adhesive material of this invention is described in this way using the conventional Storage Shear Modulus (i.e. $G'$), the conventional Loss Shear Modulus (i.e. $G''$) and the ratio of $G''$ to $G'$ herein termed the Loss Angle Ratio.

The present invention includes a dimensionally stable substrate fabricated in accordance with the technique described in co-pending patent application serial number 392,996 entitled "High Density Encapsulated Wire Circuit Board" (Varker). Wires are bonded to the substrate utilizing a photo-curable adhesive which has the following rheological properties:

(1) a Loss Angle Ratio at ambient temperature which is:

greater than about one tenth and less than about one (and preferably about three tenths to seven tenths).

(2) a Storage Shear Modulus $G'$ at ambient temperature which is:

greater than about ten to the seventh power and less than about ten to the eight power (and preferably about 2 to 4 times ten to the seventh power).

(3) the Storage Shear Modulus $G'$ at temperatures of less than and proximate 150 degrees centigrade being:

less than about ten to the sixth power.

We have found that using a photo-curable adhesive with this unique combination of rheological properties results in an encapsulated wire board which is easy to fabricate and which has great dimensional stability.

Wires are embedded in this adhesive using a conventional wiring apparatus of the type generally shown in U.S. Pat. No. 3,674,602 (Keough). After the wires have been laid in the photo-curable adhesive, the adhesive is partially cured by illuminating it with light. Next, the adhesive is thermally cured either by heat alone or as part of a high temperature laminating step. A conventional drilling operation then follows. The holes are plated and the board is finished in a conventional manner.

DESCRIPTION OF PREFERRED EMBODIMENTS

Figure 1:
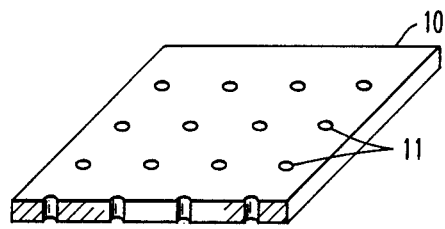
FIG. 1 illustrates a layer of copper foil showing the power clearance holes.

The base element in circuit boards fabricated in accordance with this invention is a layer of copper foil 10 shown in FIG. 1. This can be what is commonly called two ounce copper which has a weight of two ounces per square foot. The circuit board can include one or more such layers. The foil forms a ground or power plane for the circuit board. Holes 11 are drilled in this foil at all locations where connections will be made to the encapsulated wires (except at the locations where connections between the encapsulated wires and the power or ground planes are desired).

Figure 2:
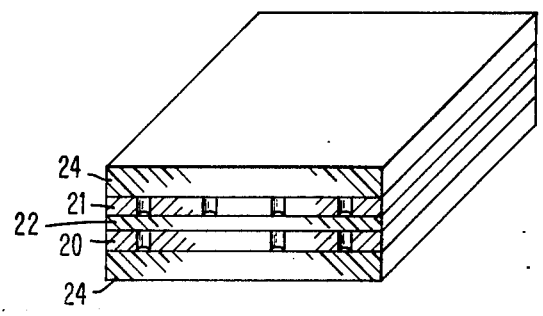
FIG. 2 illustrates a composite containing a plurality of power cores.

The particular embodiment shown here has a power plane 20 and a ground plane 21 in each composite as shown in FIG. 2. Power plane 20 and ground plane 21 are separated by a layer of epoxy resin pre-preg 22 and covered by layers of epoxy pre-preg 23 and 24. Epoxy resin pre-preg 22, 23 and 24 is conventional pre-preg which consists of glass cloth impregnated with epoxy. The epoxy pre-preg can for example be formulated as shown in U.S. Pat. No. 4,024,305.

Figure 4:
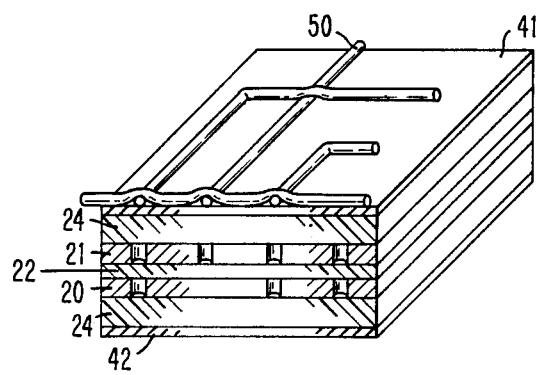
FIG. 4 illustrates a composite with wires applied.

The top and bottom layers of pre-preg 23 and 24 are covered with layers of adhesive 41 and 42 as shown in FIG. 4. The photo-curable adhesive 41 and 42 must have the following rheological properties:

The adhesive must be photo-curable to a gelled state so that once it is cured it is not soluble in non-degrading solvents such as ketones, aromatic hydrocarbons, or ether-alcohols. The adhesive must have the following rheological properties (measured at a frequency in the range of 1 to 10 cycles per second)

(1) a Loss Angle Ratio at ambient temperature which is:
greater than about one tenth, less than about one and preferably about three tenths to seven tenths.

(2) a Storage Shear Modulus G' at ambient temperature which is:
greater than about ten to the seventh power,
less than about ten to the eight power, and
preferrably about (2 to 4) times ten to the seventh power.
(Units of G' are dynes per cm. squared)

(3) the Storage Shear Modulus G' at temperatures of less than and proximate 150 degrees centigrade being:
less than about ten to the sixth power.

If the adhesive material does not have the above combination of rheological properties, the quality of the resultant circuit board and the ease of wiring will be reduced. Prior to the present invention it was not recognized that the above combination of rheological provided an advantage and there was no existing photocurable adhesive that had this unique combination of rheological properties. A particular adhesive that displays this unique combination of rheological properties is described in detail hereinafter; however, any photocurable adhesive which displays this combination of rheological properties can be used.

The circuit wires 50 are embedded in the adhesive 41 and 42 as shown in FIG. 4. This can be done utilizing the type of equipment marketed by Kollmorgen Corporation for the fabrication of "Multiwire" boards. An example of such machinery is described in U.S. Pat. No. 3,674,914 (Burr).

If a multilayer board is desired, several composites each of which has wires applied as describe above can be laminated together to form a multilayer board. The number of composites that can be laminated together is among other considerations limited by the ability to accurately drill small holes through the entire assembly.

A photo-curable adhesive which meets the requirements of the present invention can be formed using:
(1) a Bisphenol A-based epoxy resin having a molecular weight of about 1500 to 5000,
(2) a highly functional epoxidized novolac having a molecular weight of about 900 to 1500,
(3) monoethylenically unsaturated carboxylic acid
(4) a catalyst
(5) a polyethylenically unsaturated compound
(6) a photoinitiator
(7) a phenoxy resin, and
(8) a thixotropic agent The following describes how a particular photo-curable adhesive that has the unique combination of rheological properties required by the present invention can be obtained.

First, form a pre-polymer from:
(1) a bisphenol A-based epoxy resin having a molecular weight of about 1500 to 5000 such as for example Epon 1004 marketed by Shell Chemical Co.
(2) a completely or highly functionalized epoxidized novolac having a molecular weight of about 900 to 1500 such as for example Dow 485 marketed by Dow Chemical Co.

The epoxies (1) and (2) can be in a ratio of (4:1) to (1:4). A ratio of 1 to 1 is preferred.

(3) a monoethylenically unsaturated carboxylic acid such as acrylic acid, methacrylic acid or crotonic acid. There should be sufficient acid to react approximately 20 to 100 percent of the epoxide functional groups. An amount suffient to react seventy five percent is preferred. (one mole per group for the reaction).

(4) a catalyst such as a tertiary amine (for example BDMA, benzyl dimethylamine or TMBDA, tetra methyl butane diamine) or heavy metal salts such as stannous octoate or lead naphthanate. The catalyst enhances the esterification reaction of the acid and epoxy. It determines the speed of the esterification reaction. The mixture must be cooked longer if one has less of this compound in the mixture.

A diluent such as 2-ethoxyethylacetate (available under the tradename Cellosolve Acetate) or 2-(2-butoxyethoxy) ethanol (available under the tradename Butyl Carbitol) is used to obtain an acceptable viscosity. An amount sufficient to get the desired consistency for film casting should be used. An amount of diluent sufficient to obtain a viscosity in the range of about 1000 to 2200 centipoise has been found to be satisfactory for film casting. The amount of diluent used is not critical to the composition.

As described herein the adhesive material is applied to a film carrier which is laminated to the circuit board and then the carrier is removed. Alternatively the adhesive could be sprayed onto the circuit board or it could be applied by a knife coating technique. If spraying is used an amount of diluent sufficient to obtain a viscosity up to about 1000 centipoise should be used. If knife edge coating is used, an amount of diluent sufficient to obtain a viscosity of above about 2200 centipoise should be used.

Other diluents which can be used are for example:
methyl cellosolve acetate (methoxyethyl acetate)
ethyl cellosolve acetate (ethyoxyethyl acetate)
propyl cellosolve acetate (propoxyethyl acetate)
butyl cellosolve acetate (butoxyethyl acetate)
butyl carbitol 2-(2-butoxyethoxy) ethanol
diethyl carbitol bis(2-ethoxy ethyl) ether
methylene chloride - methanol (azeotrope)
methyl ethyl ketone Form the pre-polymer by cooking the above. The desired reaction conditions for such a reaction are well know and need not be describes herein in any great detail. For example, temperatures of about normal room temperature to about 75 degrees C. are suitable. Times of pre-reaction of 30 minutes and up have been found to be quite adequate.

After the above pre-polymer has been formed add the following:

(1) A photoinitiator or catalyst (such as for example TBA, tertiary butylanthroquinone); This photoinitiator or catalyst determines how many active centers will be present in the mixture when exposed to U.V. or other actinic radiation. Examples of some other suitable photoinitiators include substituted anthraquinones such as alkyl substituted or halo substituted anthraquinones including 2-tert-butylanthraquinone; other substituted or unsub-stituted polynuclear quinones including 1,4-napthaquinone, 9,10-phenanthraquinone, 1,2-benzanthraquinone, 2,3-dichloronaphthaquinone, and 1,4-dimethylanthraquinone. Other photo-sensitizers include halogen-type sensitizers such as carbontetrachloride, bromoform and carbontribromide; benzotriazole; benzoin, chloranil, benzil, diacetyl, 5-nitrosal- icylaldehyde, and 2,4-dinitrotoluene. Mixtures of photinitiators can be employed when desired. The preferred photoinitiators include the anthraquinones such as tert- butyl anthraquinone. The photoinitiator is employed in amounts sufficient to sensitize the composition to ultraviolet light and is generally from about 0.1 to about 10% and preferably from about 0.1 to about 5% of the non-volatiles of the composition.

(2) A polyethylenically unsaturated compound (such as for example TMPTA, Trimethylolpropane-triacrylate); This material in essence determines how successful each activation will be. As more of this material is added, the resultant material will cure faster with actinic radiation. This material also softens the resultant photo curable adhesive. The amount of polyethylenically unsaturated compound employed is about 10 to about 25 percent by weight of the non-volatiles of the composition. Other suitable polyethylenically unsatuated compounds include unsaturated esters of polyols and especially esters of the methylene carboxlyic acid such as ethylene diacrylate; diethylene glycol diacrylate; glycerol diacrylate; glycerol triacrylate; ethylene dimethacrylate; 1,3-propylene dimethacrylate; 1,2,4-butene triol trimethacrylate; 1,4-benzenediol dimethacrylate; pentaerythriol tetramethacrylate; 1,3-propane diol diacrylate; 1,6-hexane diol diacrylate; the bis-acrylates and methacrylates of polyethylene glycols of molecular weight 200–500; trimethylol propane triacrylate; pentaerythritol triacrylate; unsaturated amides such as those of the methylene carboxylic acids such as methylene bisacryl and bismethacrylamide; vinyl-esters such as divinyl succinate; divinyl adipate; divinyl phthalate, and divinyl terephthalate, and unsaturated aldehydes such as sorbaldehyde.

(3) A relatively high molecular weight phenoxy polymer having a molecular weight of about 30,000 to about 200,000. This phenoxy polymer is preferably a bisphenol A-based phenoxy and most preferably a bisphenol A-ephichlorohydrin phenoxy. Some commercially available phenoxy polymers include for example PKHC resin commercially available from Union Carbide. Other examples are Eponol 53, and Eponol 55 which are commercially available from Shell Chemical Corp. The molecular weight of these compounds is so high that for practical purposes one need not consider their terminal epoxide functionality. This epoxy makes the Young's modulus of the coating higher and broadens the Loss Angle ratio peak. The phenoxy polymer is employed in amounts of about 15 to 40 and preferably 20 to 30 percent by weight of the non volatile components of the composition.

(4) a thixotropic or thickening agent such as for example fumed or colloidal silica. Colloidal silica is silica having a surface ara of about 50 to about 500M-2/gram (determined by the BET nitrogen adsorption material) with particles having diameters from about 5 to about 20 millimicrons. Colloidal silica, used according to the present invention, is preferably fused silica gel or fused silicon dioxide as it is sometimes called. In addition, the colloidal silica is often referred to in the art as silica aerogel. Fused silica is obtained by the hydrolysis or combustion of silicon tetrachloride in hydrogen- oxygen furnaces. Examples of some commercially available colloidal silicas include Cab-O-Sil and Santocel. The silica is employed in amounts of about 2 to about 20 percent and preferably about 4 to about 18 percent by weight based upon the non-volatile content of the composition. Carbon black, or bentonite clay are other examples of thixotropic agents that may be used.

The composition can, but does not necessarily, contain auxiliary agents such as storage stabilizers and surfactants. For example the compositon can include:

Benzoquinone: This compound provides shelf life. It has the effect of inhibiting polymerization during storage. It is not required for the practice of this invention.

FC 430 - this is a surfactant to enhance coating the film to make it smoother. It is not required to practice the invention.

The following is a specific example of how an adhesive having the required properties can be formulated:

The following mixture is allowed to react at about 60 degrees Centigrade for about 20 hours.

a 50 percent solution of about 700 parts by weight of 2-ethoxyethylacetate (available under the tradename Cellosolve Acetate) and a solid bisphenol A-epichlorohydren epoxy resin which has a molecular weight in the range of about 1500 to 5000 (for example Epon resin 1004 which has a molecular weight of about 1750). and a 50 percent solution of about 700 parts by weight of 2-ethoxyethylacetate (available under the tradename Cellosolve Acetate) and a solid epoxidized novolac resin which has a molecular weight in the range of about 900 to 1500 (such as for example Dow DEN 485 which has a molecular weight of about 1100)

about 114 parts by weight of acrylic acid and about 7 parts by weight of benzyl dimethylamine as a promoter.

Note: The above is sufficient acrylic acid to react 75 percent of the epoxide functional groups since:

350 parts of Dow 485 divided by epoxide equivalent weight of 200=1.75

350 parts of Epon 1004 divided by epoxide equivalent weight of 950=0.37

Total times 75 percent (1.75 plus 0.37 times 0.75=1.59)

times molecular weight of acrylic acid (1.59 times 72=114)

After the above prepolymer is formed take 776 parts of the resultant prepolymer and add the following:

about 1000 parts of a 29.5 percent solution of phenoxy resin (available under the tradename PKHC from Union Carbide) in 2-ethoxy ethylacetate (available under the trade name Cellosolve Acetate).

about 80 parts of fumed silica (available under the trade name CAB-O-SIL)

disperse the CAB-O-SIL by mixing in a planetary mixer

To the above add:

about 204 parts of TMPTA about 12.3 parts of TBA about 2.8 parts of FC 430 about 0.1 gram of Benzoquinone about 526 parts of Cellosolve Acetate,

Blend the result in a planetary mixer until uniformly mixed.

The resulting composition is coated onto one side of a polyester sheet such as a polyethyleneterephthalate sheet (available under the trade name Mylar) and passed through an oven maintained at about 260 degrees F. at a speed of about 10 to 40 feet/minute (22 feet/minute is preferred) A amount is applied to the film such that the resulting dry films has a thickness of 3 mils.

Figure 3:
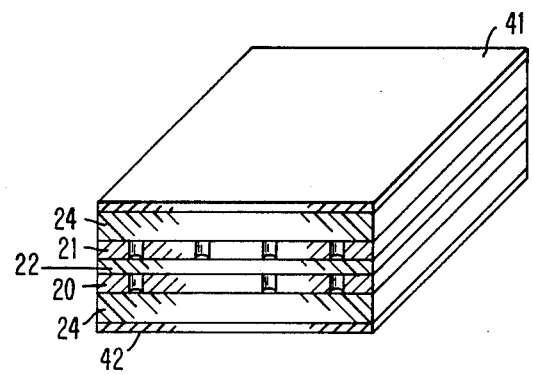
FIG. 3 illustrates a composite including the layers of adhesive.

The coated sheet is applied to a laminate as shown in FIG. 3. The polyethylenetereph thalate is next peeled from the coated composite. Wires are then applied using conventional encapsulated wire techniques. The wiring takes place at an ambient temperature of about twenty five degrees centigrade.

After the wiring operation is complete the wires are pressed further into the adhesive by laminating the composite under a pressure of about 170 psi for about 30 minutes.

The coating is then thoroughly exposed using conventional actinic radiation (for example using carbon arc, high pressure mercury lamps etc.

In order to insure that the composite is sufficiently cured the resulting composite can be post-cured at about 160 degrees C. for about 2 hours. If several composites are laminated together to form a multi layer board this curing can take place during that lamination operation.

The critical rheological properties of the material formulated as described above which make it suitable for the present invention and which no other material previously used for this purpose satisfied are:

(1) it is photo-curable (2) the value of its Loss Angle Ratio at ambient temperature is about 0.4 (that is, it is greater than about 0.1 and less than about 1.0)

(3) The value of its Storage Shear Modulus $G'$ at ambient temperature is about 3 times 10 to the 7th (that is it is greater than about 10 to the 7th and less than about ten to the eighth)

(4) the value of its Storage Shear Modulus $G'$ at 125 degrees centigrade is about ten to the fifth power (that is the Storage Shear Modulus $G'$ at temperatures of less than and proximate 150 degrees centigrade is less than about ten to the sixth power).

Other examples of compositions which meet the requirements of the present invention are:

| Example compound | 2 parts | 3 parts | 4 parts | 5 parts |
|---|---|---|---|---|
| EPON 1004 | 19.4 | 21 | 21 | 21 |
| DOW 485 | 19.4 | 21 | 21 | 21 |
| ACRYLIC ACID | 6.3 | 7 | 7 | 7 |
| BDMA | .4 | .42 | .42 | .42 |
| TMPTA | 18.7 | 5.4 | 5.4 | 5.4 |
| TBA | 1.1 | 1.2 | 1.2 | 1.2 |
| BENZOQUINONE | .01 | .01 | .01 | .01 |
| FC430 | .3 | .3 | .3 | .3 |
| PKHC | 27.1 | 30 | 30 | 15 |
| CAB-O-SIL | 7.3 | 8 | 4 | 20 |

Each of the above is formulated in the same way as the first example and the resulting compound will have the required rheological properties.

We have illustrated and described the preferred embodiments of the invention; however, it is to be understood that we do not limit ourselves to the precise construction herein disclosed and the right is reserved to all changes and modifications coming within the scope of the invention as defined by the appended claims.

I claim:

1. A photo-curable adhesive composition from:

a Bisphenol A-based epoxy resin having a molecular weight of about 1500 to 5000;

a epoxidized novolak having a molecular weight of about 900 to 1500;

monoethylenically unsaturated carboxylic acid;

a polyethylenically unsaturated compound selected from the group of unsaturated esters of polyols, unsaturated amides, vinyl esters, and unsaturated aldehydes;

a photoinitiator;

phenoxy resin which has a very high molecular weight; and a thixotropic agent selected from the group of colloidal silica, carbon black, and bentonite clay, and having measured in the dry state at a frequency in the range of 1 to 10 cycles per second (a) a Loss Angle Ratio at ambient temperature of 0.3–0.7;

(b) a Storage Shear Modulus $G'$ at ambient temperature of greater than about $10^7$ to less than about $10^8$ dynes/cm$^2$; and (c) a Storage Shear Modulus $G'$ at temperatures of below 150° C. of less than about $10^6$ dynes/cm$^2$ to about $10^5$ dynes/cm$^2$.

2. The photocurable adhesive composition of claim 1 wherein the ratio of said bisphenol A-base epoxy resin to said novolac is 4:1 to 1:4.

3. The photocurable adhesive of claim 2 wherein said ratio is 1:1.

4. The photocurable adhesive of claim 1 wherein said carboxylic acid is present in an amount sufficient to react approximately 20% to 100% of the total epoxide functional groups.

5. The photocurable adhesive of claim 1 wherein said carboxylic acid is present in an amount sufficient to react 75% of the total epoxide functional groups.

6. The photocurable adhesive of claim 1 which comprises a prepolymer from said bisphenol A-based epoxy resin, said epoxidized novolac, and said monoethylenically unsaturated carboxylic acid.

7. The photocurable adhesive of claim 6 which further includes an esterification catalyst.

8. The photocurable adhesive of claim 1 which further includes an esterification catalyst.

9. The photocurable adhesive of claim 8 wherein said esterification catalyst is a tertiary amine or heavy metal salt.

10. The photocurable adhesive of claim 1 wherein the amount of said photoinitiator is sufficient to sensitize the adhesive to ultraviolet light.

11. The photocurable adhesive of claim 1 wherein the amount of said photoinitiator is about 0.1% to about 10% of the non-volatiles of the adhesive.

12. The photocurable adhesive of claim 1 wherein the amount of said photoinitiator is about 0.1% to about 5% by weight of the non-volatiles of the adhesive.

13. The photocurable adhesive of claim 1 wherein the amount of said polyethylenically unsaturated compound is about 10% to about 25% by weight of the non-volatiles of the adhesive.

14. The photocurable adhesive of claim 13 wherein the said polyethylenically unsaturated compound is trimethylolpropanetriacrylate.

15. The photocurable adhesive of claim 1 wherein said phenoxy polymer has a molecular weight of about 30,000 to about 200,000 and is employed in amounts of about 15% to about 40% by weight of the non-volatile components of said adhesive.

16. The photocurable adhesive of claim 15 wherein said phenoxy polymer is employed in amounts of about 20% to about 30% by weight of the non-volatile components of said adhesive.

17. The photocurable adhesive of claim 15 wherein said phenoxy is a bisphenol A-based phenoxy.

18. The photocurable adhesive of claim 15 wherein said phenoxy is a bisphenol A-epichlorohydrin phenoxy.

19. The photocurable adhesive of claim 1 wherein said thixotropic agent is colloidal silica and is employed in amounts of about 2% to about 20% by weight based upon the non-volatile content of the adhesive.

20. The photocurable adhesive of claim 1 wherein said thixotropic agent is employed in amounts of about 4% to about 18% by weight based upon the non-volatile content of the adhesive.

21. The photocurable adhesive of claim 1 which further contains a storage stabilizer and a surfactant.

22. The photocurable adhesive of claim 21 wherein said stabilizer includes benzoquinone.

23. The photocurable adhesive of claim 1 which comprises a prepolymer from said bisphenol A-based epoxy resin, said epoxidized novolac, and said monoethylenically unsaturated carboxylic acid, wherein the ratio of said bisphenol A-based epoxy resin to said novolac is 4:1 to 1:4; wherein said carboxylic acid is present in amount sufficient to react approximately 20% to 100% of the epoxide functional group; wherein the amount of said photoinitiator is about 0.1% to about 10% of the non-volatiles of the adhesive; wherein the amount of said polyethylenically unsaturated compound is about 10% to about 25% by weight of the non-volatiles of the adhesive; wherein said phenoxy polymer has a molecular weight of about 30,000 to about 200,000, is a bisphenol A-based phenoxy, and is employed in amounts of about 15% to about 40% by weight of the non-volatile components of said adhesive; and wherein said thixotropic agent is colloidal silica and is employed in amounts of about 2% to about 20% by weight based upon the non-volatile content of the adhesive.

24. The photocurable adhesive of claim 1 wherein said polyethylenically unsaturated compound is selected from the group of ethylene diacrylate; diethylene glycol diacrylate; glycerol diacrylate; glycerol triacrylate; ethylene dimethacrylate; 1,3-propylene dimethacrylate; 1,2,4-butene triol trimethacrylate; 1,4-benzenediol dimethacrylate; pentaerythriol tetramethacrylate; 1,3-propane diol diacrylate; 1,6-hexane diol diacrylate; the bis-acrylates and methacrylates of polyethylene glycols of molecular weight 200-500; trimethylol propane triacrylate; pentaerythritol triacrylate; methylene bisacryl and bismethacrylamide; divinyl succinate; divinyl adipate; divinyl phthalate; divinyl terephthalate; and sorbaldehyde.

25. The adhesive composition of claim 1 wherein said Storage Shear Modulus G' at ambient temperature is about $2 \times 10^7$ to about $4 \times 10^7$ dynes/cm$^2$.

* * * * *